US008250508B2

(12) United States Patent
Sakamoto

(10) Patent No.: US 8,250,508 B2
(45) Date of Patent: Aug. 21, 2012

(54) METHOD AND APPARATUS FOR ANALYSIS AND DESIGN OF A SEMICONDUCTOR DEVICE USING IMPURITY CONCENTRATION DISTRIBUTION

(75) Inventor: Hironori Sakamoto, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 237 days.

(21) Appl. No.: 12/482,016

(22) Filed: Jun. 10, 2009

(65) Prior Publication Data

US 2009/0319967 A1    Dec. 24, 2009

(30) Foreign Application Priority Data

Jun. 18, 2008   (JP) .................................. 2008-159702

(51) Int. Cl.
*G06F 17/50*     (2006.01)
*G06F 9/455*     (2006.01)
(52) U.S. Cl. ............ 716/112; 716/110; 716/111; 703/2; 703/14
(58) Field of Classification Search ........................ None
See application file for complete search history.

(56) References Cited

U.S. PATENT DOCUMENTS

| | | | | |
|---|---|---|---|---|
| 5,761,082 | A * | 6/1998 | Miura-Mattausch | ........... 703/14 |
| 6,154,718 | A * | 11/2000 | Sakamoto | ........................ 703/12 |
| 6,577,993 | B1 * | 6/2003 | Sakamoto | ........................ 703/14 |
| 6,697,771 | B1 * | 2/2004 | Kondo et al. | ..................... 703/2 |
| 7,685,543 | B2 * | 3/2010 | Tsuji et al. | .................... 716/106 |
| 2008/0028342 | A1 * | 1/2008 | Tsuji et al. | ........................ 716/2 |
| 2009/0319967 | A1 * | 12/2009 | Sakamoto | .......................... 716/4 |
| 2010/0318950 | A1 * | 12/2010 | Sakamoto | ..................... 716/106 |

OTHER PUBLICATIONS

R. Booth et al., The Effect of Channel Implants on MOS Transistor Characterization, IEEE Transactions on Electron Devices, vol. ED-34, pp. 2501-2508, Dec. 1997.*
Mitiko Miura-Mattausch et al.,Unified Complete MOSFET Model for Analysis of Digital and Analog Circuits, IEEE Transaction on Computer-aided Design Integrated Circuits and Systems, Jan. 1996, pp. 1-7, vol. 15, No. 1.
Yon-Sup Pang et al., "Analytical Subthreshold Surface Potential Model for Pocket n-MOSFETs", IEEE Transaction on Electric Devices, Dec. 2002, pp. 1-8, vol. 49, No. 12.

* cited by examiner

*Primary Examiner* — Leigh Garbowski
*Assistant Examiner* — A. M. Thompson
(74) *Attorney, Agent, or Firm* — Sughrue Mion, PLLC

(57) ABSTRACT

An analysis and design apparatus for semiconductor device, which utilizes a transistor model using accurate channel impurity concentration distribution are provided. The analysis and design apparatus includes a parameter setting portion that divides a channel region into a plurality of regions, and temporarily sets a plurality of impurity concentrations for the plurality of regions as a plurality of parameters. Further, the analysis and design apparatus includes an element characteristic calculation portion that values of electric characteristics of the transistor using surface potential that is calculated by solving a Poisson equation using a plurality of effective impurity concentrations. Moreover, the determination portion compares the calculated values with measured values read from a storage portion based on the structure information, and determines that the plurality of parameters for the transistor when the measured values correspond to the calculated values.

8 Claims, 7 Drawing Sheets

METHOD AND APPARATUS FOR ANALYSIS AND DESIGN OF A SEMICONDUCTOR DEVICE USING IMPURITY CONCENTRATION DISTRIBUTION

INCORPORATION BY REFERENCE

This application is based upon and claims the benefit of priority from Japanese patent application No. 2008-159702 filed on Jun. 18, 2008, the disclosure of which is incorporated herein in its entirety by reference.

BACKGROUND OF THE INVENTION

1. Field of the Invention

The present invention relates to an analysis and design apparatus for semiconductor device and an analysis and design method for semiconductor device. In particular, the present invention relates to an analysis and design apparatus for semiconductor device and an analysis and design method for semiconductor device, which utilize a transistor model using accurate channel impurity concentration distribution.

2. Description of Related Art

A technique for analyzing characteristics of electronic element such as a transistor has been known. For example, "Analytical Subthreshold Surface Potential Model for Pocket n-MOSFETs", Y. S. Pang, et al., IEEE Trans. On Electron Devices, Vol. 49, No. 12, pp. 2209-2216, (2002) discloses a technique for analyzing characteristics of a MOS transistor. Hereinafter, this paper is also referred to as "Pang" in this specification. FIG. 1 is a sectional view showing a structure of a MOS transistor of this model. A MOS transistor 150 as the model transistor includes a source region 155, a drain region 153, a gate oxide film 152, a channel region 154 and a gate electrode 151. The source region 155 and the drain region 153 are provided on a surface region of a semiconductor substrate across the channel region 154. The gate oxide film 152 and the gate oxide film 152 are laminated in this order so as to cover the channel region 154. According to this technique, the channel region 154 is divided into three regions depending on a channel impurity concentration as an impurity concentration in the channel region 154 in a depth direction. The widths of the regions are defined as Lp, Lc, Lp, respectively, and the impurity concentrations of the regions are defined as Np, Nc, Np, respectively. Here, Lp, Lc, Np, Nc are set as model parameters so as to correspond to actual transistor channel impurity concentration distribution well. Next, a surface potential in each region of the channel region 154 is obtained by solving a Poisson equation using the surface potential as a variable. Subsequently, electric characteristics of the transistor are calculated using the obtained surface potential. Here, the electric characteristics of the transistor are exemplified by a gate capacitance $C_{gg}$—gate voltage $V_g$ characteristic and a threshold voltage $V_{th}$—substrate voltage $V_b$ characteristic (or a drain current $I_d$—substrate voltage $V_b$ characteristic). A method described in Pang and well-known conventional method can be adopted as a method of calculating these electric characteristics. Here, in the case where the obtained transistor electric characteristics (calculated values) do not correspond to actual transistor electric characteristics (measured values), the model parameters are adjusted and the above-mentioned calculation is repeated. When the calculated values correspond to the measured values, it is deemed that the model parameter reproduce the actual transistor channel impurity concentration distribution. Then, analysis of a semiconductor element and design of a semiconductor circuit are performed using the obtained model parameters.

Another method of calculating the electric characteristics of the transistor is described in the paper of "Unified complete MOSFET model for analysis of digital and analog circuits", M. Miura-Mattausch, U. Feldmann, A. Rahm, M. Bollu, and D. Savignac, Proc. IEEE Trans. On Comput.-AidedDes./Int. Conf. Comput. Aided Des., vol. 15, no. 1, pp. 1-7, January (1996). Hereinafter, this paper is also referred to as "Miura" in this specification.

We have now discovered the following facts. According to the above-mentioned technique in Pang, the effect that effective channel impurity concentration in the vicinity of the source region 155 and the drain region 153 decreases due to influence of the source region 155 and the drain region 153 is not incorporated. For this reason, it is deemed that the surface potential calculated using the above-mentioned model parameters cannot represent the actual surface potential accurately. Therefore, even if the transistor electric characteristics are obtained using the calculated surface potential, the actual transistor electric characteristics cannot be represented with high accuracy. In other words, the transistor electric characteristics of the transistor model in Pang cannot represent the actual transistor electric characteristics with high accuracy. As a result, non-negligible errors may be observed in analysis of the semiconductor element and design of the semiconductor circuit.

SUMMARY

The present invention seeks to solve one or more of the above problems, or to improve upon those problems at least in part.

In one embodiment, an analysis and design apparatus for semiconductor device, includes: a storage portion configured to store structure information indicating a structure of a transistor and measured values of electric characteristics of the transistor, associated with each other; a parameter setting portion configured to divide a first channel region of a first transistor into a first plurality of regions, and temporarily set a first plurality of impurity concentrations for the first plurality of regions, respectively, as a first plurality of parameters; an element characteristic calculation portion configured to calculate a first plurality of effective impurity concentrations in the first plurality of regions, respectively, based on the first plurality of parameters by reducing impurity concentrations in first vicinity regions in both ends of the first channel region, calculate a first surface potential by solving a Poisson equation using the first plurality of effective impurity concentrations, and calculate first calculated values of electric characteristics of the first transistor using the first surface potential; and a determination portion configured to compare the first calculated values with first measured values read from the storage portion based on a first structure information indicating a structure of the first transistor, determine the first plurality of parameters for the first transistor when the first measured values correspond to the first calculated values, and store the first structure information and the first plurality of parameters associated with each other in the storage portion, wherein the parameter setting portion, the element characteristic calculation portion and the determination portion are operated until the first measured values correspond to the first calculated values.

In another embodiment, an analysis and design method for semiconductor device, includes: dividing a first channel region of a first transistor into a first plurality of regions; temporarily setting a first plurality of impurity concentrations for the first plurality of regions, respectively, as a first plurality of parameters; calculating a first plurality of effective impurity concentrations in the first plurality of regions, respectively, based on the first plurality of parameters by reducing impurity concentrations in first vicinity regions in both ends of the first channel region; calculating a first surface potential by solving a Poisson equation using the first plurality of effective impurity concentrations; calculating first calculated values of electric characteristics of the first transistor using the first surface potential; comparing the first calculated values with first measured values read from the storage portion, which store structure information indicating a structure of a transistor and measured values of electric characteristics of the transistor, associated with each other, based on a first structure information indicating a structure of the first transistor; determining the first plurality of parameters for the first transistor when the first measured values correspond to the first calculated values; and storing the first structure information and the first plurality of parameters associated with each other in the storage portion, wherein the temporarily setting step to the comparing step are operated until the first measured values correspond to the first calculated values.

In another embodiment, a computer-readable medium including code that, when executed, causes a computer to perform the following: dividing a first channel region of a first transistor into a first plurality of regions; temporarily setting a first plurality of impurity concentrations for the first plurality of regions, respectively, as a first plurality of parameters; calculating a first plurality of effective impurity concentrations in the first plurality of regions, respectively, based on the first plurality of parameters by reducing impurity concentrations in first vicinity regions in both ends of the first channel region; calculating a first surface potential by solving a Poisson equation using the first plurality of effective impurity concentrations; calculating first calculated values of electric characteristics of the first transistor using the first surface potential; comparing the first calculated values with first measured values read from the storage portion, which store structure information indicating a structure of a transistor and measured values of electric characteristics of the transistor, associated with each other, based on a first structure information indicating a structure of the first transistor; determining the first plurality of parameters for the first transistor when the first measured values correspond to the first calculated values; and storing the first structure information and the first plurality of parameters associated with each other in the storage portion, wherein the temporarily setting step to the comparing step are operated until the first measured values correspond to the first calculated values.

According to the present invention, analysis and design of the semiconductor device can be achieved more accurately.

BRIEF DESCRIPTION OF DRAWINGS

The above and other objects, advantages and features of the present invention will be more apparent from the following description of certain preferred embodiments taken in conjunction with the accompanying drawings, in which.

DESCRIPTION OF THE PREFERRED EMBODIMENTS

Embodiments of an analysis and design apparatus for a semiconductor device and an analysis and design method for a semiconductor device according to the present invention will be described below with reference to accompanying drawings.

According to the present invention, a transistor model incorporating an effect that the impurity concentration in the channel region decreases in the vicinity of a source region and a drain region as the effective impurity concentration is used. By solving Poisson equation using such model, a surface potential can be calculated with high accuracy. Then, using the surface potential, the transistor electric characteristics can be reproduced with high accuracy. As a result, analysis of the semiconductor element and design of the semiconductor circuit can be performed more accurately. This will be described in detail.

Figure 1:
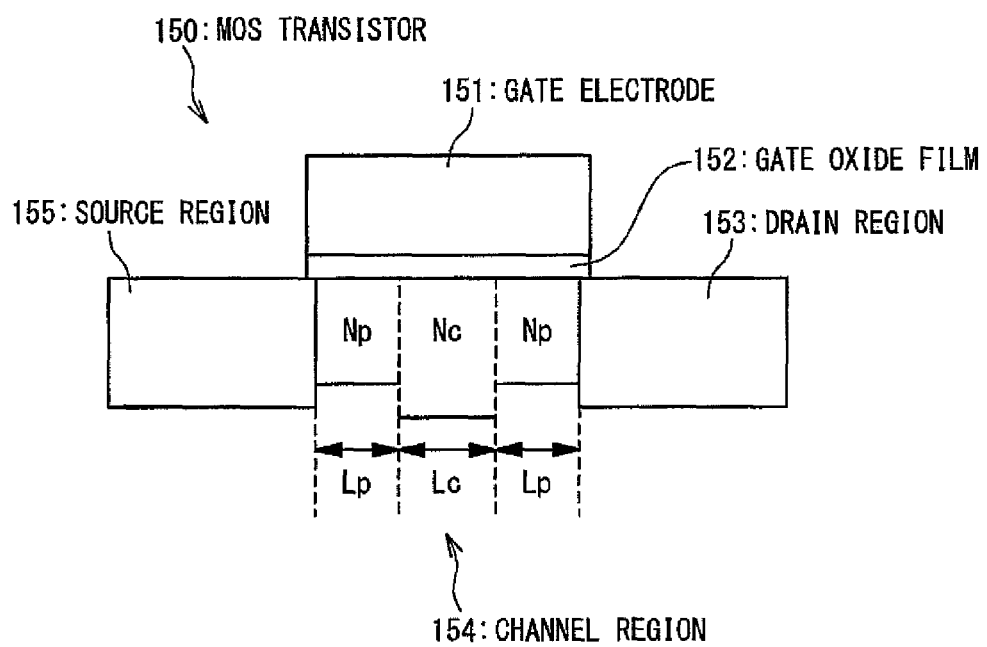
FIG. 1 is a sectional view showing a model structure of a MOS transistor described in Pang.
Figure 2:
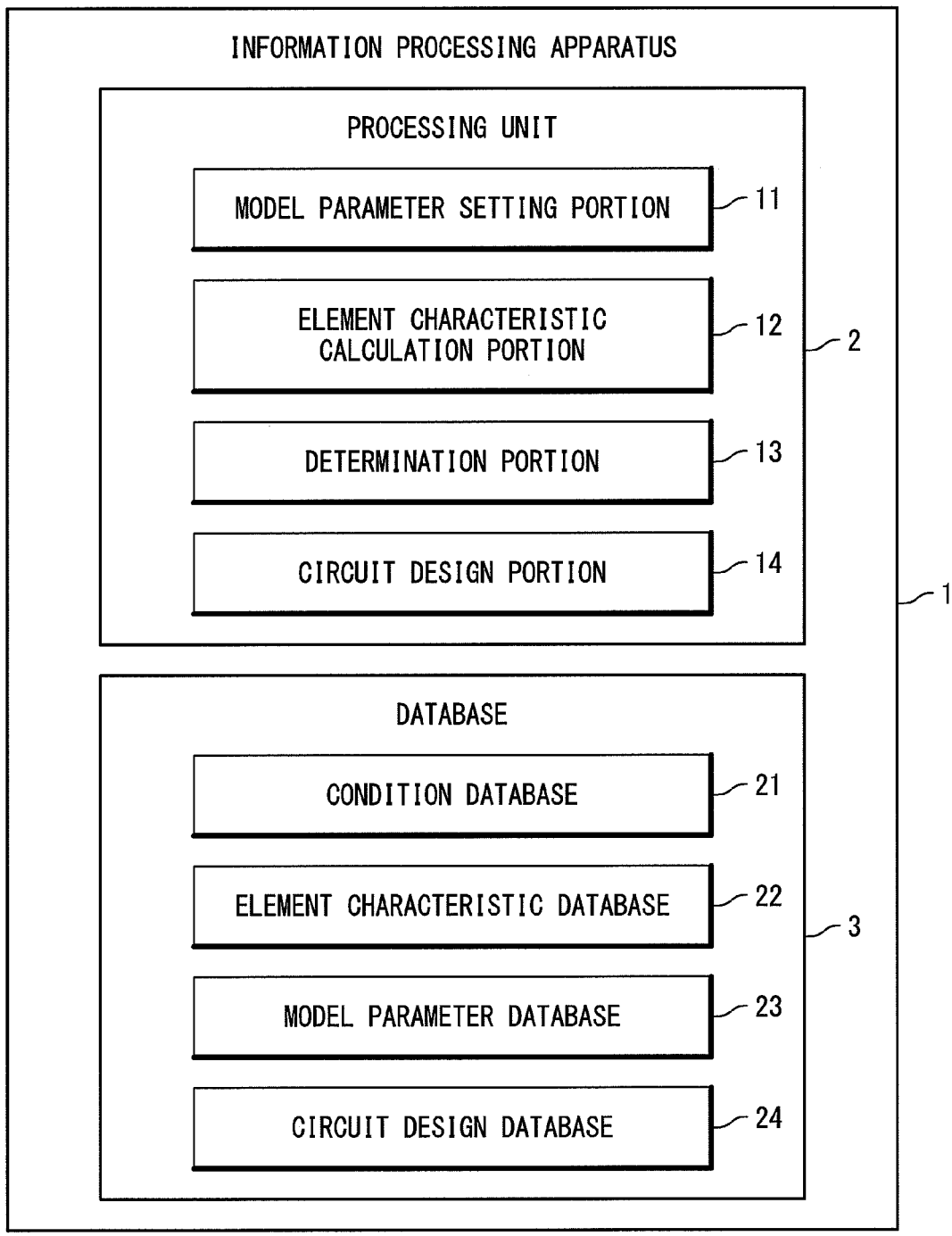
FIG. 2 is a block diagram showing a configuration of an information processing apparatus according to an embodiment of the present invention.

FIG. 2 is a block diagram showing a configuration of an information processing apparatus according to an embodiment of the present invention. The information processing apparatus 1 functions as an apparatus for analyzing and designing the semiconductor device. In other words, the information processing apparatus 1 performs set of the transistor model parameters, calculation of the effective channel impurity concentration distribution, calculation of the surface potential using the effective channel impurity concentration distribution, calculation of the transistor electric characteristics using the surface potential and design of the semiconductor circuit using the transistor electric characteristics. The information processing apparatus 1 includes a processing unit 2 and a database 3.

The information processing apparatus 1 is exemplified by a computer. A processing unit 2 is, for example, a program which is stored in a storage device (not shown), read and expanded in a memory (not shown), and executed by a CPU (not shown). The processing unit 2 includes a model parameter setting portion 11, an element characteristic calculation portion 12, a determination portion 13 and a circuit design portion 14.

The model parameter setting portion 11 sets the transistor channel impurity concentration distribution (model parameters: widths L1, L2, L3, . . . and impurity concentrations N1, N2, N3, . . . of the regions, described later).

The element characteristic calculation portion 12 calculates depletion layer widths (W1, W2, W3, . . . ) in the channel impurity concentration distribution which is set by the model parameter setting portion 11 or stored in the model parameter database 23, and determines depletion layers 1, 2, 3, . . . . Then, the element characteristic calculation portion 12 calculates the effective channel impurity concentration in which the channel impurity concentration distribution (including the depletion layers) is modified. After that, the element characteristic calculation portion 12 calculates the surface potential using the effective channel impurity concentration distribution and the transistor electric characteristics using the surface potential.

The determination portion 13 compares the transistor electric characteristics calculated by the element characteristic calculation portion 12 with measured values of the transistor electric characteristics, which are stored in an element characteristic database 22, and determines whether or not they correspond to each other.

The circuit design portion 14 performs design (logic design and layout design) of the semiconductor circuit using the transistor electric characteristics calculated by the element characteristic calculation portion 12 or the transistor electric characteristics stored in a circuit design database 24.

The database 3 is data and a program which are stored in a storage device (not shown) and read or written by a CPU (not shown). The database 3 includes a condition database 21, the element characteristic database 22, a model parameter database 23 and the circuit design database 24. The database 3 may be provided outside of the information processing apparatus 1 so as to bi-directionally communicate with each other. These databases in the database 3 may be integrated or separated.

The condition database 21 associates information on transistor manufacturing conditions (including size) with information on transistor operational conditions, and stores the information therein. Here, the information on the transistor operational conditions is exemplified by a substrate voltage $V_b$, a gate voltage $V_g$ and an operational temperature T. The information on the transistor manufacturing conditions is exemplified by information on a manufacturing method such as manufacturing conditions (ion implantation condition, diffusion condition) of a diffusion layer (source region/drain region) and information on a transistor configuration such as transistor size (gate length $L_g$, gate width $w_g$, oxide film thickness $T_{ox}$). As described above, since the information on the transistor manufacturing conditions (including size) can be deemed to identify the transistor structure, the information can be recognized as information identifying the structure (structure information).

The element characteristic database 22 associates the information on the transistor manufacturing conditions (including size), the information on the transistor operational conditions and information on measured values of the transistor electric characteristics with one another, and stores the information therein. Here, the information on the measured values of the transistor electric characteristics is exemplified by a gate capacitance $C_{gg}$—gate voltage $V_g$ characteristic and a threshold voltage $V_{th}$—substrate voltage $V_b$ characteristic (or a drain current $I_d$—substrate voltage $V_b$ characteristic) which are measured at an actual transistor.

The model parameter database 23 associates the model parameters (widths L1, L2, L3, . . . , impurity concentrations N1, N2, N3, . . . of the regions) representing the effective channel impurity concentration distribution which is set by the model parameter setting portion 11 and determined its correspondence by the determination portion 13 with information on the manufacturing conditions (including size) of the transistor, and stores the information therein.

The circuit design database 24 associates information on the transistor electric characteristics calculated by the element characteristic calculation portion 12 with the information on the transistor manufacturing conditions (including size), and stores the information therein. The information may be stored as a part of a cell/block library relating to a basic logic gate, a logic circuit block and a cell, for example.

The circuit design database 24 further stores information necessary for circuit design therein.

Next, the method of analyzing the semiconductor device (including setting of the model parameters and calculation of the effective channel impurity concentration distribution) will be described.

Figure 3:
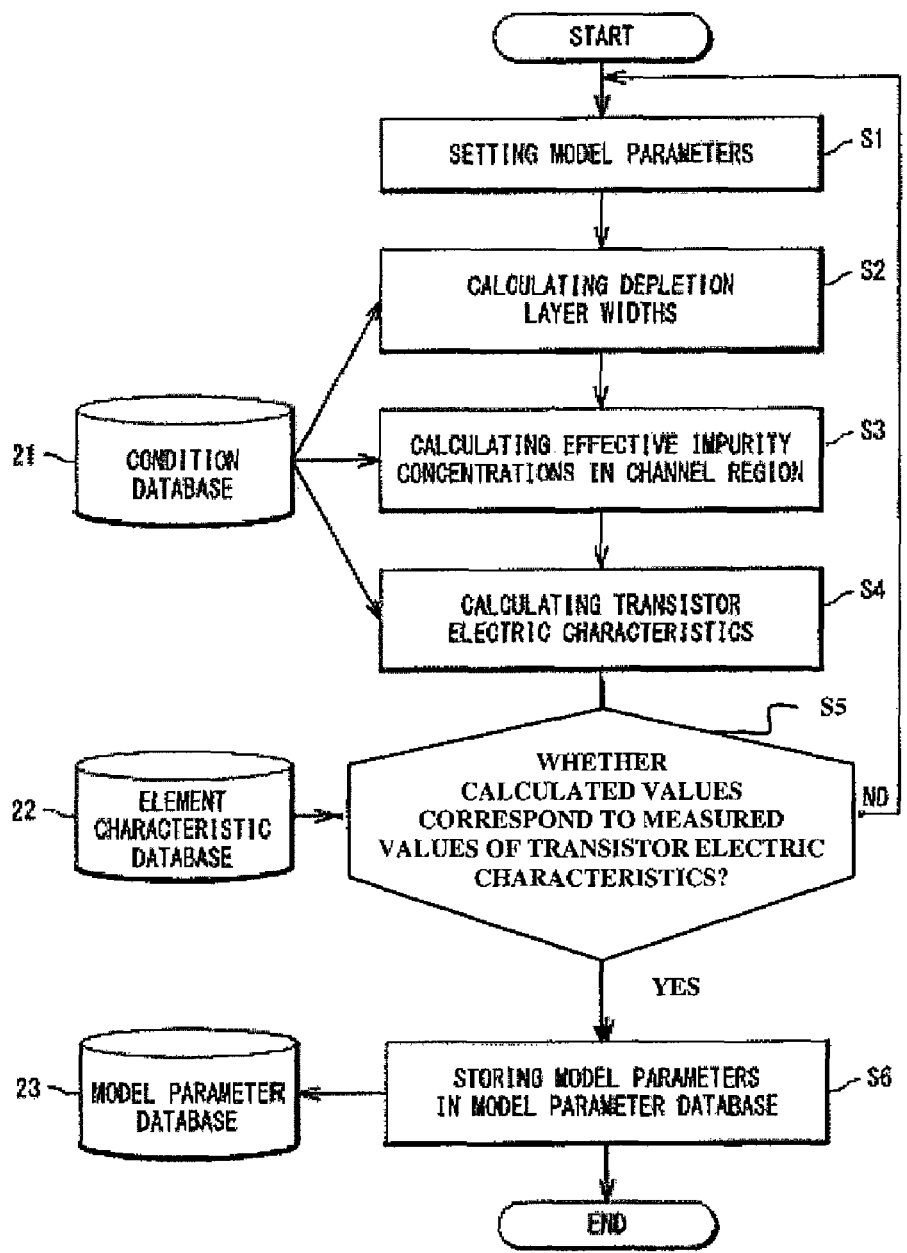
FIG. 3 is a flow chart showing an operation of the information processing apparatus according to the embodiment of the present invention.

FIG. 3 is a flow chart showing an operation of the information processing apparatus according to the embodiment of the present invention. The operation of the information processing apparatus 1 functions as a method of analyzing the semiconductor device.

Figure 4:
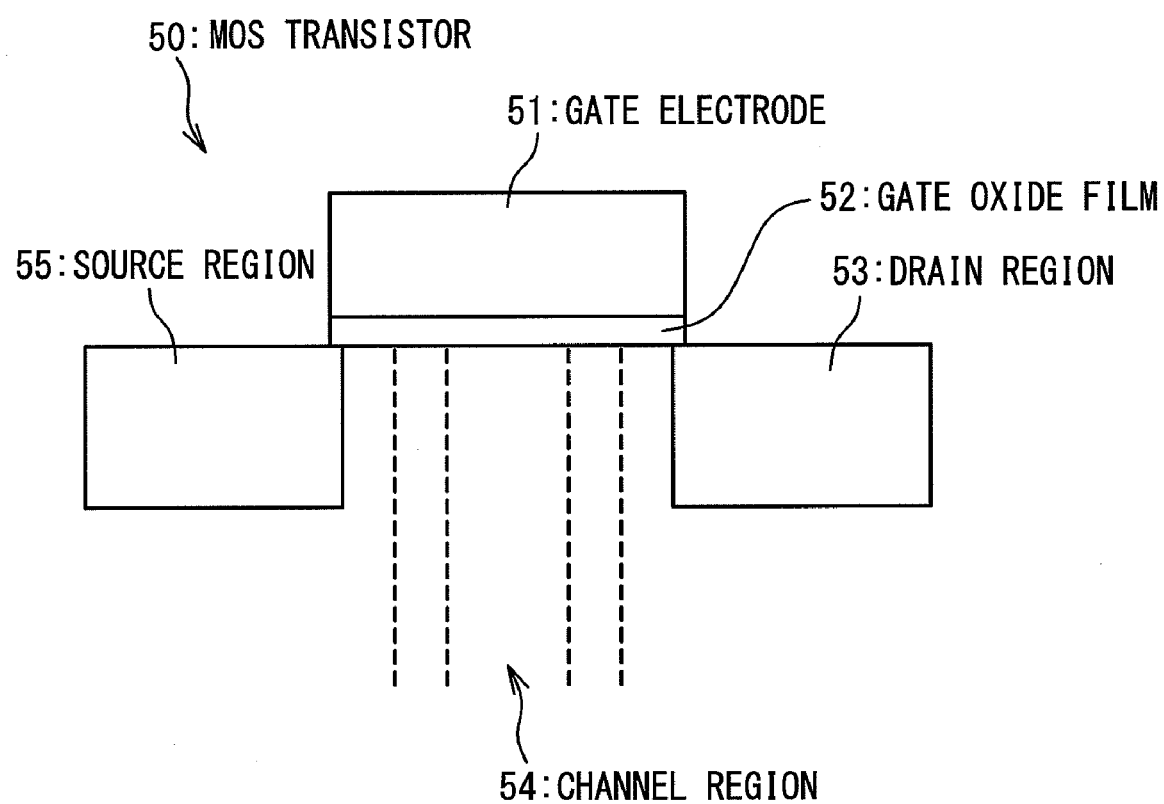
FIG. 4 is a sectional view showing a model structure of a MOS transistor according to the embodiment of the present invention.

First, a MOS transistor 50 as a model transistor is considered. FIG. 4 is a sectional view showing a structure of the MOS transistor 50. The MOS transistor 50 includes a source region 55, a drain region 53, a gate oxide film 52, a channel region 54 and a gate electrode 51. The source region 55 and the drain region 53 are provided on a surface region of a semiconductor substrate across the channel region 54. The gate oxide film 52 and the gate electrode 51 are laminated in this order so as to cover the channel region 54. The structure and manufacturing method of this MOS transistor 50 are identified based on the information of the above-mentioned manufacturing conditions of the transistor.

Figure 5:
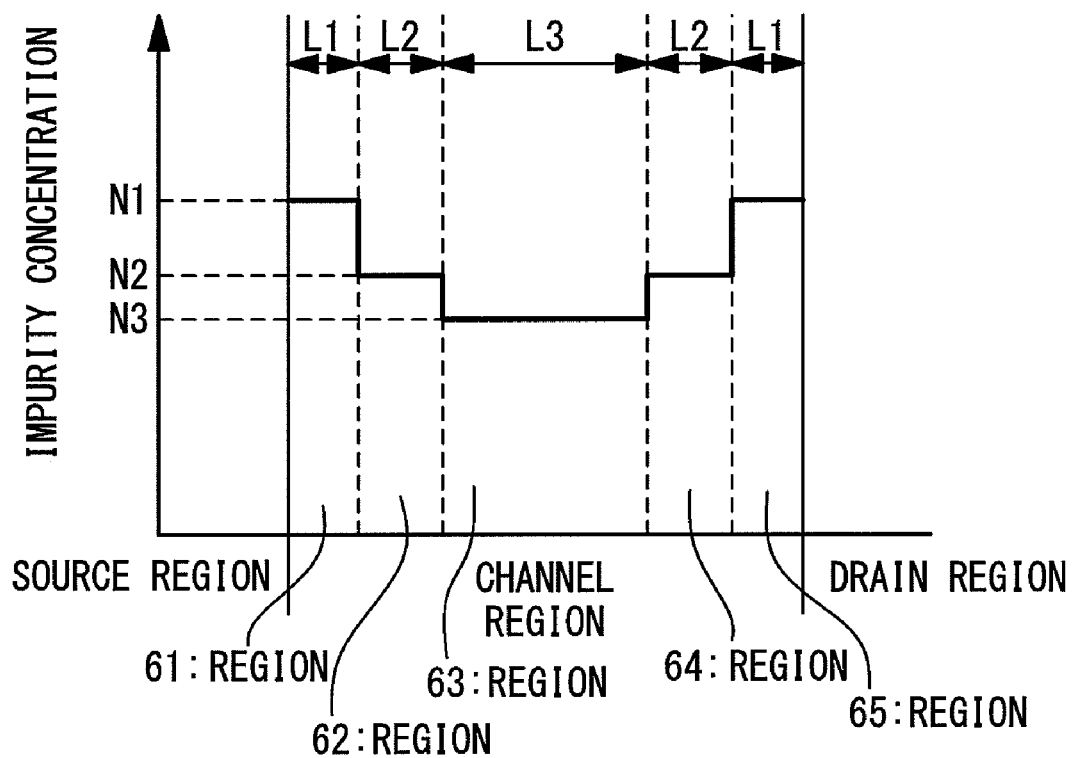
FIG. 5 is a graph showing a width and impurity concentration of each divided region in the channel region in an example according to the embodiment of the present invention.

First, it is considered that the channel region 54 is divided into a plurality of regions depending on the impurity concentration. The number of divided regions may be set previously or may be set by the user each time. Widths of the plurality of divided regions are defined as L1, L2, L3, . . . , respectively, and impurity concentration of them are defined as N1, N2, N3, . . . , respectively, from a side of the source region 55. The widths L1, L2, L3, . . . and the impurity concentrations N1, N2, N3, . . . are defined as model parameters. FIG. 5 is a graph showing the width and impurity concentration of each divided region in the channel region in an example. In this example, the channel region is divided into five regions 61 to 65 which are bilaterally symmetric about the center of the channel region 54. The model parameters are the widths L1, L2, L3, L2, L1 and the impurity concentrations N1, N2, N3, N2, N1. Under such conditions, based on the externally-inputted actual channel impurity concentration distribution of the transistor to be estimated, the model parameter setting portion 11 sets (assumes) the model parameters so as to correspond to the actual channel impurity concentration distribution well (Step S1). The model parameters may be also set based on the user's input.

Figure 6:
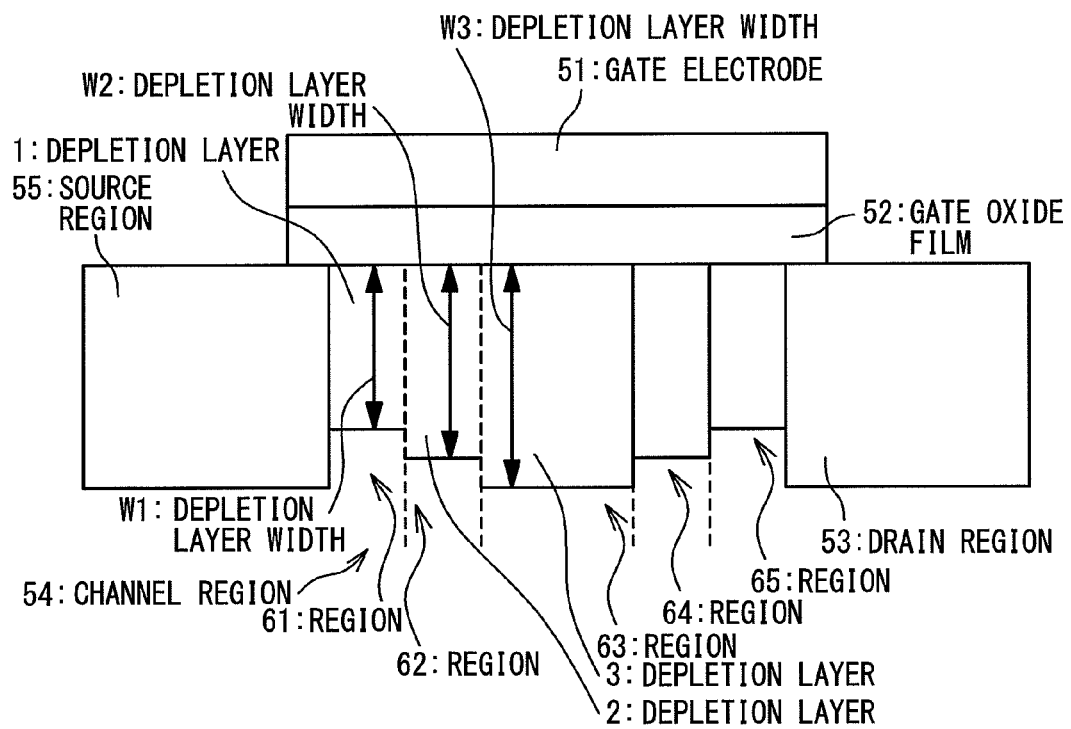
FIG. 6 is an enlarged sectional view showing the channel region of the MOS transistor set in FIG. 5.

FIG. 6 is an enlarged sectional view showing the channel region of the MOS transistor 50 set in FIG. 5. First, based on the manufacturing conditions (including size) of the transistor to be estimated, the element characteristic calculation portion 12 reads information on operational conditions of the transistor referring to the condition database 21. Then, based on the read information (ex. bias condition and temperature) and the set model parameters, the element characteristic calculation portion 12 calculates the depletion layer widths W1, W2, W3, W2, W1 for the regions 61 to 65 according to the below-mentioned expression (1).

The calculation method is as follows. First, a Poisson equation (the below-mentioned Expression (2) described later) is solved using the impurity concentrations N1 to N5 to calculate the surface potential $\phi s_{1i}$ (i=1 to 5) However, here, $N_{i0}$ (i=1 to 5) is substituted with the set values N1 to N5 in the Expression (2). In addition, adjustment of the depletion layer at Step S3 is not performed. Next, the below-mentioned Expression (1) is solved using the obtained surface potential $\phi s_{1i}$ (i=1 to 5) and the impurity concentrations N1 to N5 to calculate the depletion layer widths W1, W2, W3, W2, W1.

Thereby, the element characteristic calculation portion 12 determines the depletion layer 1 having the depletion layer width W1 in the region 61, the depletion layer 2 having the depletion layer width W2 in the region 62, the depletion layer 3 having the depletion layer width W3 in the region 63, the depletion layer 4 having the depletion layer width W2 in the region 64 and the depletion layers 5 having the depletion layer width W1 in the region 65 (Step S2).

[Expression 1]

$$W_i = \sqrt{\frac{2\varepsilon_{Si}(\beta \cdot \phi_{s1i} - 1)}{q \cdot N_i \cdot \beta}} \quad (1)$$

Here, each symbol means as follows.
$W_i$: (i=1 to 5), depletion layer widths W1 to W5
$N_i$: (i=1 to 5), impurity concentration N1 to N5
q: Elementary electric charge
$\varepsilon_{si}$: Dielectric constant of silicon
$\phi_{s1i}$: Surface potential of region 6i (i=1 to 5)
$\beta$: $q/(k_B T)$ ($k_B$: Boltzmann constant, T: Operational temperature (absolute temperature) of transistor Here, based on the information on the manufacturing conditions of the MOS transistor 50, the element characteristic calculation portion 12 reads values of the above-mentioned symbols at Step 2 referring to the condition database 21 and uses these values.

Figure 7:
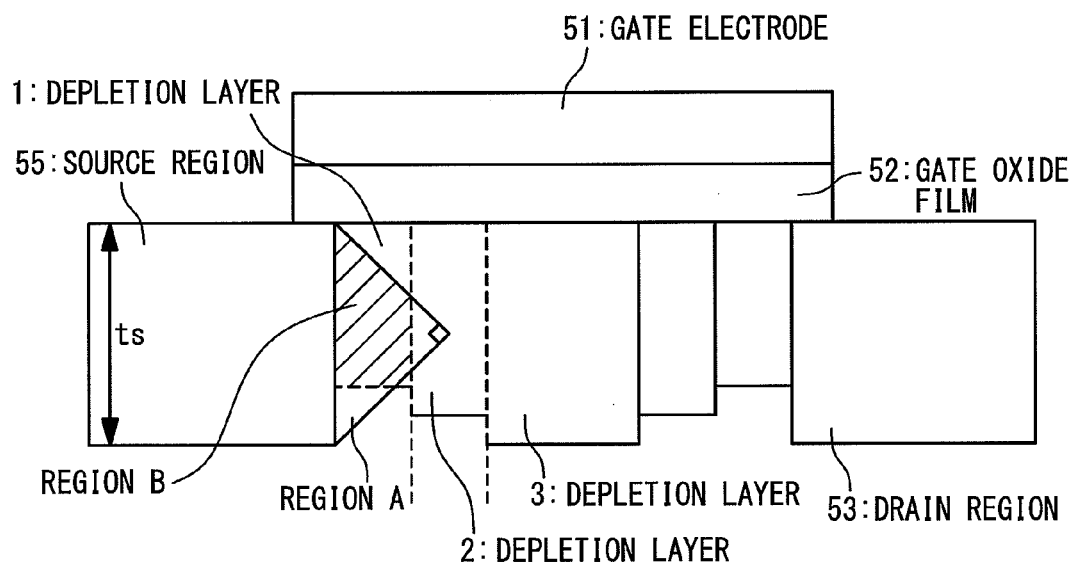
FIG. 7 is a sectional view showing adjustment of a depletion layers of the channel region shown in FIG. 6.

Next, to incorporate the effect that the effective channel impurity concentration decreases due to influence of the source region 55 and the drain region 53, the element characteristic calculation portion 12 adjusts the depletion layers obtained at Step S 2. FIG. 7 is a sectional view showing adjustment of the depletion layers of the channel region shown in FIG. 6. First, a region A as a right triangle extending its area from the end of the source region 55 toward the channel region 54 is defined. The region A is a right triangle having a base as an end of the source region 55, the length of which is equal to a thickness is of the source region 55. In the right triangle, when a side is determined, the overall form is uniquely determined. Therefore, the right triangle is preferably easy to be set and fit to the actual situation. It is assumed that the effective impurity concentration is 0 (zero) in the region A (including the case where the effective impurity concentration can be regarded as 0 (zero) in the calculation even if it is not 0 (zero) actually). Here, it is assumed that a region which belongs to both the depletion layer 1 and the region A is a region B and an area of the region B is SB. Furthermore, it is assumed that an area of the depletion layer 1 is S 1 (=L1×WW). As described above, the impurity concentration of the depletion layer 1 is N 1. At this time, the effective impurity concentration N 10 of the depletion layer 1 can be expressed as follows.

$$N_{10}=N1\times(S1-SB)/S1$$

Similarly, the effective impurity concentrations $N_{20}$, $N_{30}$, ... of the depletion layers 2, 3, ... can be calculated. This also applies to a side of the drain region 53. In the example shown in FIG. 7, the effective impurity concentrations $N_{10}$, $N_{20}$, $N_{30}$, $N_{40}$, $N_{50}$ of the depletion layers 1, 2, 3, 4, 5 are calculated in this manner (Step S3).

Next, in the channel region 54 of the MOS transistor 50, the element characteristic calculation portion 12 solves a Poisson equation (the below-mentioned Expression (2)) with respect to the surface potential $\phi$s by using the effective impurity concentrations $N_{10}$ to $N_{50}$ of the depletion layers 1 to 5 in the regions 61 to 65, and finds solutions $\phi s_{10}$ to $\phi s_{50}$ of the surface potential $\phi$s for each of the regions 61 to 65.

[Expression 2]

$$C_{ox}(V_g - V_{FB} - \phi_{Si0}) = \sqrt{\frac{2q\varepsilon_{Si}}{\beta}} \left[ N_{i0} \cdot (\beta \cdot (\phi_{Si0} - V_b) - 1 + \exp(-\beta \cdot (\phi_{Si0} - V_b))) + \frac{n_i^2}{N_{i0}} \exp(-\beta \cdot V_f) \cdot (\exp(\beta \cdot \phi_{Si0}) - \exp(\beta \cdot V_b)) \right]^{\frac{1}{2}} \quad (2)$$

Here, each symbol means as follows.
$C_{ox}$: Gate capacitance
$V_g$: Gate voltage
$V_{FB}$: Flat band voltage
$N_{i0}$: Effective impurity concentration of depletion layer i (i=1 to 5)
$\phi s_{i0}$: Surface potential of region 6i (i=1 to 5)
$V_b$: Substrate voltage
$\beta$: $k_B T$ ($k_B$: Boltzmann constant, T: Operational temperature (absolute temperature) of transistor
$n_i$: Carrier density of intrinsic semiconductor
$V_f$: Quasi Fermi level Based on the information on the manufacturing conditions of the MOS transistor 50, the element characteristic calculation portion 12 reads values of the above-mentioned symbols at Step S3 and this calculation referring to the condition database 21, and uses the values.

After that, the element characteristic calculation portion 12 calculates the surface potential $\phi s_0$ (function of the position in the channel region) obtained by connecting the surface potentials $\phi_{10}$ to $\phi s_{50}$ of the regions 61 to 65 with a smooth curve from the end of the source region 55 to the end of the drain region 53. As the method of connecting the plurality of surface potentials $\phi s_{10}$ to $\phi s_{50}$ in the channel region 54 with a smooth curve, the method described in Pang can be used.

Subsequently, the element characteristic calculation portion 12 calculates electric characteristics (ex. the gate capacitance $C_{gg}$—gate voltage $V_g$ characteristic and the threshold voltage $V_{th}$—substrate voltage $V_b$ characteristic (or the drain current $I_d$—substrate voltage $V_b$ characteristic)) of the transistor using the surface potential $\phi s_0$ of the obtained solution (Step S4). As the method of calculating the electric characteristics of the transistor from the surface potential $\phi s_0$, the method described in the above-mentioned Pang or the above-mentioned Miura can be used. Based on the information on the manufacturing conditions of the MOS transistor 50, the element characteristic calculation portion 12 reads values of the above-mentioned symbols at Step S4 referring to the condition database 21 and uses the values.

Next, the determination portion 13 compares calculated values of the obtained transistor electric characteristics with measured values of the actual transistor electric characteristics (Step S5). Here, based on the information on the manufacturing conditions of the MOS transistor 50, the determination portion 13 reads the measured values of the actual transistor electric characteristics at Step S5 referring to the element characteristic database 22 and uses the values.

Here, in the case where the calculated values and the measured values of the transistor electric characteristics do not correspond to each other (Step S5: No), the determination portion 13 returns processing to Step S1. Then, based on the user's input, the model parameter setting portion 11 adjusts the model parameters selected last time so that the calculated values and the measured values of the electric characteristics correspond to each other while satisfying the above-mentioned predetermined conditions and sets new model parameters (Step S1). Hereinafter, the steps S2 to S4 are performed in a similar manner. Until the calculated values and the measured values of the transistor electric characteristics correspond to each other (Step S5: Yes), the steps S1 to S4 are repeated while adjusting the model parameters.

When the calculated values and the measured values of the transistor electric characteristics correspond to each other (Step S5: Yes), the determination portion 13 sets the model parameters as model parameters representing actual transistor channel impurity concentration distribution. Then, the determination portion 13 associates the model parameters with information on the manufacturing conditions of the MOS transistor 50, and stores them in the model parameter database 23 (Step S6). Here, in consideration of error, the correspondence means that a difference between both values falls within a predetermined range (for example, ±5%).

According to the above-mentioned method of analyzing the semiconductor device, the model parameters which can appropriately represent the channel impurity concentration distribution can be calculated accurately. Thereby, two-dimensional distribution of the channel impurity concentration and the surface potential can be reproduced accurately.

According to the above-mentioned method of analyzing the semiconductor device, a set of model parameters (channel impurity concentration distribution) is calculated for information on the manufacturing conditions of one MOS transistor 50. Such calculation of the model parameters (the above-mentioned Steps S1 to S6) is performed for each of various manufacturing methods and structures (including size) which can be expected in a circuit design. Thereby, the model parameter database 23 can store the model parameters of various transistors which can be expected in the circuit design.

According to the present invention, in the MOS transistor, the model parameters (channel impurity concentration distribution) corresponding to the actual transistor electric characteristics can be set more accurately. Since the channel impurity concentration distribution using such model parameters can calculate the surface potential accurately, the transistor electric characteristics calculated based on the surface potential can be reproduced with high accuracy. As a result, analysis of the semiconductor element and design of the semiconductor circuit can be achieved with reduced error. Although the number of the divided channel regions is five in the above-mentioned embodiment, the present invention is not limited to this example.

Next, a method of designing the semiconductor device (including calculation of the transistor electric characteristics and circuit design) will be described.

Figure 8:
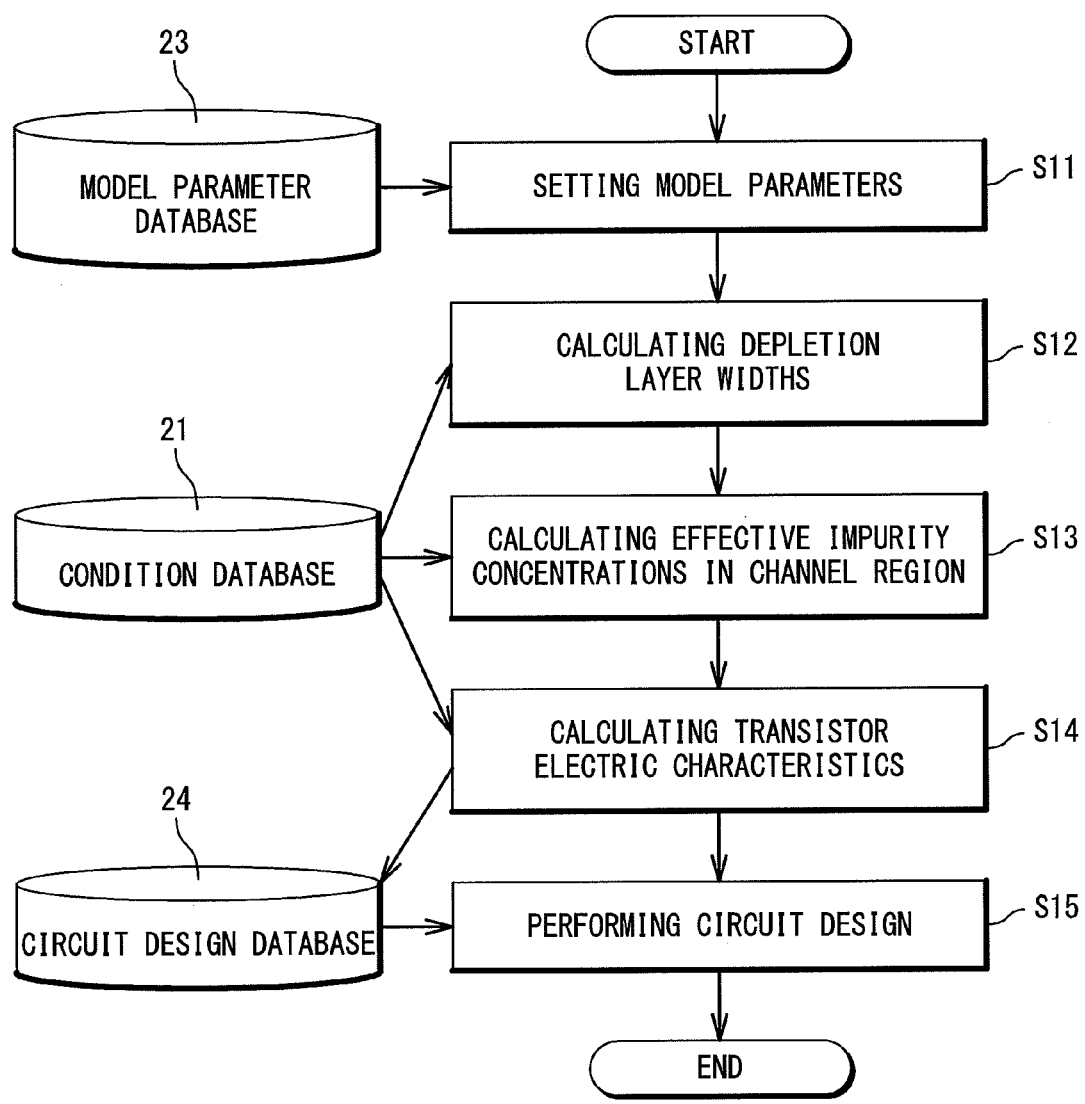
FIG. 8 is a flow chart showing an operation of the information processing apparatus according to the embodiment of the present invention.

FIG. 8 is a flow chart showing an operation of the information processing apparatus according to the embodiment of the present invention. The operation of the information processing apparatus 1 functions as the method of designing the semiconductor device.

First, based on the externally-inputted manufacturing method and structure (including size) of the target MOS transistor, the element characteristic calculation portion 12 extracts proper model parameters referring to the model parameter database 23 (Step S11). The external inputting is exemplified by the user's input and extract from data on design.

Next, based on the information on the manufacturing conditions (including size) of the transistor, the element characteristic calculation portion 12 reads information on the operational conditions of the transistor referring to the condition database 21. Then, based on the read information (bias condition and temperature) and the set model parameters, the depletion layer widths W1, W2, W3, W2, W1 in the regions 61 to 65, respectively, are calculated.

The calculation method is as follows. First, the Poisson equation (the above-mentioned Expression (2)) is solved using the impurity concentrations N1 to N5 to calculate the surface potential $\phi s_{1i}$ (i=1 to 5). Here, $N_{10}$ (i=1 to 5) is substituted with the N1 to N5 as set values in the Expression (2). Adjustment of the depletion layers at Step S13 is not performed. Next, the above-mentioned Expression (1) is solved using the obtained surface potential $\phi s_{1i}$ (i=1 to 5) and the impurity concentrations N1 to N5 to calculate the depletion layer widths W1, W2, W3, W2, W1.

Thereby, the element characteristic calculation portion 12 determines depletion layer 1 (the depletion layer width W1) to the depletion layer 5 (the depletion layer width W1) in each of the regions 61 to 65 (Step S12).

Next, to incorporate the effect that the effective channel impurity concentration due to influence of the source region 55 and the drain region 53, the element characteristic calculation portion 12 adjusts the depletion layers obtained at Step S12. Then, the element characteristic calculation portion 12 calculates the effective impurity concentrations $N_{10}$ to $N_{50}$ in the depletion layers 1 to 5 (region 61 to 65) (Step S13).

Subsequently, the element characteristic calculation portion 12 solves the Poisson equation (the above-mentioned Expression (2)) with respect to the surface potential $\phi s$ using the effective impurity concentrations $N_{10}$ to $N_{50}$ in the regions 61 to 65 and obtains solutions $\phi s_{10}$ to $\phi s_{50}$ of the surface potential $\phi s$. Then, by connecting the obtained surface potentials $\phi s_{10}$ to $\phi s_{50}$ with a smooth curve, the surface potential $\phi s_0$ (function of the position in the channel region) in whole of the channel region 54 is obtained. After that, using the surface potential $\phi s_0$ of the obtained solution, the transistor electric characteristics (ex. the gate capacitance $C_{gg}$—gate voltage $V_g$ characteristic and the threshold voltage $V_{th}$—substrate voltage $V_b$ characteristic (or the drain current $I_d$—substrate voltage $V_b$ characteristic)) are calculated (Step S14). As the Method of calculating the transistor electric characteristics from the surface potential $\phi s_0$, the method described in the above-mentioned Pang and the above-mentioned Miura. Based on the information on the manufacturing conditions of the MOS transistor 50, the element characteristic calculation portion 12 reads values at S13, S14 referring to the condition database 21 and uses the values.

The element characteristic calculation portion 12 associates the obtained information on the transistor electric characteristics with the information on the manufacturing conditions (including size) of the transistor, and stores the information in the circuit design database 24 as a part of the library containing basic logic gates, logic circuit blocks and cells.

Next, based on the manufacturing method and structure (including size) of the target transistor, the circuit design portion 14 reads the appropriate transistor electric characteristics and other information necessary for a circuit design referring to the design database 24 and performs design of a circuit using the transistor (Step S15). The circuit design is exemplified by a logic design such as an architecture design, a logic circuit design and a transistor circuit design (basic circuit design) and a layout design such as floor planning/placement and routing and layout certification.

According to the above-mentioned method of analyzing the semiconductor device and method of designing the semiconductor device, more accurate surface potential $\phi s_0$ can be calculated by using the channel impurity concentration distribution (model parameters) calculated more accurately, and more accurate transistor electric characteristics can be calculated by using them. In addition, the semiconductor circuit can be designed with reduced error by using the calculated more accurate electric characteristics.

According to the present invention, in the MOS transistor, the channel impurity concentration distribution can be set more accurately using the model parameters. Furthermore, since the surface potential can be accurately calculated depending on the more accurately-set impurity concentration distribution, the transistor electric characteristics calculated using the surface potential can be reproduced with high accuracy. As a result, the semiconductor circuit can be designed with reduced error.

The program and the data structure according to the present invention may be recorded in a computer-readable storage medium and read from the storage medium into the information processing apparatus 1.

The present invention is not limited to the above-mentioned each embodiment and it is obvious that each embodiment can be appropriately modified or changed within a technical scope of the present invention.

Although the present invention has been described above in connection with several exemplary embodiments thereof, it would be apparent to those skilled in the art that those exemplary embodiments are provided solely for illustrating the present invention, and should not be relied upon to construe the appended claims in a limiting sense.

What is claimed is:

1. An analysis and design apparatus for semiconductor device, comprising:
   a storage portion configured to store structure information indicating a structure of a transistor and measured values of electric characteristics of said transistor, associated with each other;
   a parameter setting portion configured to divide a first channel region of a first transistor into a first plurality of regions, and temporarily set a first plurality of impurity concentrations for said first plurality of regions, respectively, as a first plurality of parameters;
   an element characteristic calculation portion configured to calculate a first plurality of effective impurity concentrations in said first plurality of regions, respectively, based on said first plurality of parameters by reducing impurity concentrations in first vicinity regions in both ends of said first channel region, calculate a first surface potential by solving a Poisson equation using said first plurality of effective impurity concentrations, and calculate first calculated values of electric characteristics of said first transistor using said first surface potential; and
   a determination portion configured to compare said first calculated values with first measured values read from said storage portion based on a first structure information indicating a structure of said first transistor, determine said first plurality of parameters for said first transistor when said first measured values correspond to said first calculated values, and store said first structure information and said first plurality of parameters associated with each other in said storage portion,
   wherein said parameter setting portion, said element characteristic calculation portion and said determination portion are operated until said first measured values correspond to said first calculated values.

2. The analysis and design apparatus for semiconductor device according to claim 1, further comprising:
   a circuit design portion configured to calculate a circuit design,
   wherein said element characteristic calculation portion is configured to:
   read from said storage portion, based on a second structure information indicating a structure of a second transistor, a second plurality of parameters corresponding to said second structure information in a second plurality of regions in a second channel region of said second transistor,
   calculate a second plurality of effective impurity concentrations in said second plurality of regions, respectively, based on said second plurality of parameters by reducing impurity concentrations in second vicinity regions in both ends of said second channel region,
   calculate a second surface potential by solving a Poisson equation using said second plurality of effective impurity concentrations, and
   calculate second calculated values of electric characteristics of said second transistor using said second surface potential,
   wherein said circuit design portion is configured to calculate a circuit design using said second transistor based on said second calculated values.

3. An analysis and design method for semiconductor device, comprising:
   dividing a first channel region of a first transistor into a first plurality of regions;
   temporarily setting a first plurality of impurity concentrations for said first plurality of regions, respectively, as a first plurality of parameters;
   calculating, by a processor, a first plurality of effective impurity concentrations in said first plurality of regions, respectively, based on said first plurality of parameters by reducing impurity concentrations in first vicinity regions in both ends of said first channel region;
   calculating a first surface potential by solving a Poisson equation using said first plurality of effective impurity concentrations;
   calculating first calculated values of electric characteristics of said first transistor using said first surface potential;
   comparing said first calculated values with first measured values read from a storage portion, which store structure information indicating a structure of a transistor and measured values of electric characteristics of said transistor, associated with each other, based on a first structure information indicating a structure of said first transistor;
   determining said first plurality of parameters for said first transistor when said first measured values correspond to said first calculated values; and
   storing said first structure information and said first plurality of parameters associated with each other in said storage portion,
   wherein said temporarily setting step to said comparing step are operated until said first measured values correspond to said first calculated values.

4. The analysis and design method for semiconductor device according to claim 3, wherein said step of calculating said first plurality of effective impurity concentrations, for each of said first plurality of regions, includes:
   calculating a first depletion layer width based on said each of said first plurality of parameters, and
   calculating each of said first plurality of effective impurity concentrations by reducing said impurity concentrations in said first vicinity regions in said both ends of said first channel region based on said each first parameter and said first depletion layer width.

5. The analysis and design method for semiconductor device according to claim 3, further comprising:
reading from said storage portion, based on a second structure information indicating a structure of a second transistor, a second plurality of parameters corresponding to said second structure information in a second plurality of regions in a second channel region of said second transistor;
calculating a second plurality of effective impurity concentrations in said second plurality of regions, respectively, based on said second plurality of parameters by reducing impurity concentrations in second vicinity regions in both ends of said second channel region;
calculating a second surface potential by solving a Poisson equation using said second plurality of effective impurity concentrations;
calculating second calculated values of electric characteristics of said second transistor using said second surface potential; and
calculating a circuit design using said second transistor based on said second calculated values.

6. A computer-readable storage medium comprising code that, when executed, causes a computer to perform the following:
dividing a first channel region of a first transistor into a first plurality of regions;
temporarily setting a first plurality of impurity concentrations for said first plurality of regions, respectively, as a first plurality of parameters;
calculating a first plurality of effective impurity concentrations in said first plurality of regions, respectively, based on said first plurality of parameters by reducing impurity concentrations in first vicinity regions in both ends of said first channel region;
calculating a first surface potential by solving a Poisson equation using said first plurality of effective impurity concentrations;
calculating first calculated values of electric characteristics of said first transistor using said first surface potential;
comparing said first calculated values with first measured values read from a storage portion, which store structure information indicating a structure of a transistor and measured values of electric characteristics of said transistor, associated with each other, based on a first structure information indicating a structure of said first transistor;
determining said first plurality of parameters for said first transistor when said first measured values correspond to said first calculated values; and
storing said first structure information and said first plurality of parameters associated with each other in said storage portion,
wherein said temporarily setting step to said comparing step are operated until said first measured values correspond to said first calculated values.

7. The computer-readable storage medium according to claim 6, wherein said step of calculating said first plurality of effective impurity concentrations, for each of said first plurality of regions, includes:
calculating a first depletion layer width based on said each of said first plurality of parameters, and
calculating each of said first plurality of effective impurity concentrations by reducing said impurity concentrations in said first vicinity regions in said both ends of said first channel region based on said each first parameter and said first depletion layer width.

8. The computer-readable storage medium according to claim 6, further comprising:
reading from said storage portion, based on a second structure information indicating a structure of a second transistor, a second plurality of parameters corresponding to said second structure information in a second plurality of regions in a second channel region of said second transistor;
calculating a second plurality of effective impurity concentrations in said second plurality of regions, respectively, based on said second plurality of parameters by reducing impurity concentrations in second vicinity regions in both ends of said second channel region;
calculating a second surface potential by solving a Poisson equation using said second plurality of effective impurity concentrations;
calculating second calculated values of electric characteristics of said second transistor using said second surface potential; and
calculating a circuit design using said second transistor based on said second calculated values.

* * * * *

UNITED STATES PATENT AND TRADEMARK OFFICE
CERTIFICATE OF CORRECTION

PATENT NO.        : 8,250,508 B2
APPLICATION NO.   : 12/482016
DATED             : August 21, 2012
INVENTOR(S)       : Hironori Sakamoto It is certified that error appears in the above-identified patent and that said Letters Patent is hereby corrected as shown below:

In the Specifications

Column 7, Line 51: Delete "$(=L1 \times WW)$." and insert -- $(=L1 \times W1)$. --

Column 8, Line 19: Delete "$N_{10}$:" and insert -- $N_{i0}$: --

Column 10, Line 9: Delete "$N_{10}$" and insert -- $N_{i0}$ --

Signed and Sealed this
Sixth Day of May, 2014

Michelle K. Lee
*Deputy Director of the United States Patent and Trademark Office*